(12) United States Patent
Kim

(10) Patent No.: US 7,605,980 B2
(45) Date of Patent: Oct. 20, 2009

(54) IMAGE SENSOR AND FABRICATING METHOD THEREOF

(75) Inventor: Shang Won Kim, Ansung-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/863,350

(22) Filed: Sep. 28, 2007

(65) Prior Publication Data

US 2008/0151378 A1  Jun. 26, 2008

(30) Foreign Application Priority Data

Dec. 22, 2006 (KR) ................ 10-2006-0132346

(51) Int. Cl.
*G02B 27/10* (2006.01)
(52) U.S. Cl. ................ 359/626; 359/619
(58) Field of Classification Search ............... 359/626
See application file for complete search history.

(56) References Cited

U.S. PATENT DOCUMENTS

2006/0023314 A1* 2/2006 Boettiger et al. ............ 359/621

2007/0063300 A1* 3/2007 Hwang ................ 257/432

FOREIGN PATENT DOCUMENTS

JP 1998-10-143708 12/1999
KR 10-2003-0027019 11/2004

* cited by examiner

*Primary Examiner*—Jordan M. Schwartz
*Assistant Examiner*—James C Jones
(74) *Attorney, Agent, or Firm*—Saliwanchik, Lloyd & Saliwanchik

(57) ABSTRACT

An image sensor and fabricating method thereof are provided. The image sensor can include differently microlenses formed on a pixel array substrate. The differently shaped microlenses are formed using a phase mask where the light blocking region for each microlens pattern is positioned according to the relative angle of the microlens to a main lens. The phase shift mask results in a dome shaped microlens at a region of the pixel array substrate receiving incident light from the same axis as light incident the main lens and in asymmetrical shaped microlenses with a thicker region in a portion of the microlens farthest from the dome shaped microlens.

6 Claims, 8 Drawing Sheets

IMAGE SENSOR AND FABRICATING METHOD THEREOF

CROSS-REFERENCE TO RELATED APPLICATION

The present application claims the benefit under 35 U.S.C. §119 of Korean Patent Application No. 10-2006-0132346, filed Dec. 22, 2006, which is hereby incorporated by reference in its entirety.

BACKGROUND

A CMOS (complementary metal oxide semiconductor) image sensor is a device employing a switching method where outputs of unit pixels are sequentially detected by MOS transistors, the number of which is identical to that of unit pixels. The MOS transistors are formed on a semiconductor substrate, and a control circuit and a signal processing circuit are used as peripheral circuits.

That is, a photodiode and a MOS transistor are formed in each unit pixel so that the CMOS image sensor realizes an image by sequentially detecting electric signals of the unit pixels using the switching method. Since the CMOS image sensor uses CMOS fabrication technology, the power consumption is low and the fabrication process is simplified. This simplification can be due to the reduced number of photo processes.

In order to increase the photo sensitivity of the CMOS image sensor, a microlens is formed above the photodiode to refract the path of incident light, making it possible to concentrate an increased amount of light on the photodiode area.

However, the light incident on the edge of the microlens is not incident in parallel with an optical axis, but may be incident in an off-axis form.

Accordingly, the light, which is not parallel with the optical axis, is refracted from the microlens to reach an undesirable area in the substrate, for example, a wiring area, through the path. Therefore, the path taken to the undesirable area creates a problem by not focusing the light on a light reaction area such that shifting of the focus occurs, thereby causing a malfunction of the device.

SUMMARY

Embodiments of the present invention provide a fabricating method of an image sensor capable of increasing the light collection rate of a photodiode by correcting the focus shift of a lens. According to embodiments, the microlenses are formed using a phase shift mask.

A fabricating method of an image sensor according to an embodiment includes: forming a color filter array on a pixel array substrate including a photosensor; coating a photoresist for a microlens on the color filter array; forming a lens pattern array formed with a step difference through exposing and developing the photoresist; and forming different shaped microlenses by reflowing the lens pattern array.

Also, an image sensor according to an embodiment includes: a color filter array formed on a pixel array substrate on which a photosensor is formed; and a microlens array formed on the color filter array; wherein each of the microlenses of the microlens array is formed in a different shape.

DETAILED DESCRIPTION

An image sensor and a fabricating method thereof according to embodiments of the present invention will be described with reference to the accompanying drawings.

Figure 3:
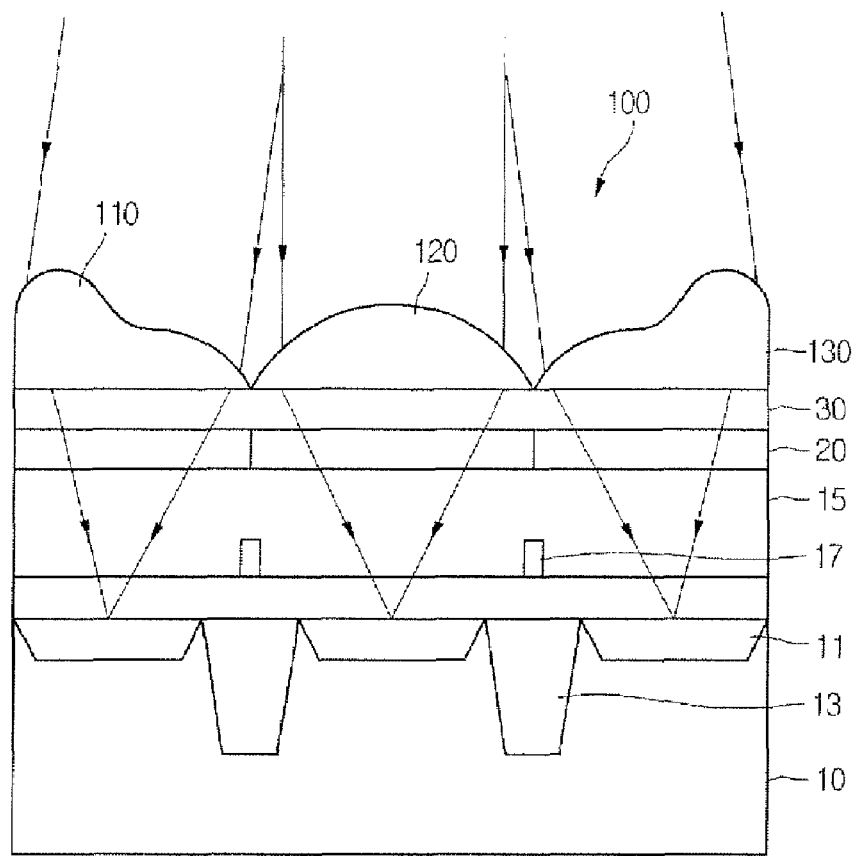

FIG. 3 is a cross-sectional view showing an image sensor according to an embodiment. Referring to FIG. 3, a photodiode 11, an interlayer dielectric layer 15, and a metal wiring 17 are formed on a pixel array substrate 10.

A device isolating layer 13 defining an active area and an isolation area is formed on the pixel array substrate 10. Each unit pixel is formed with a photodiode 11 in the active area receiving light to generate photo-charge.

The interlayer dielectric layer 15 is formed on the substrate including the device isolating layer 13 and the photodiode 11, and the metal wiring 17 is formed in the interlayer isolating layer 15.

A color filter array 20 can be formed on the substrate to separate colors from incident light to implement a color image. The color filter array 20 can include first, second, and third color filters per unit pixel.

A microlens array 100 can be formed on the color filter array 20 to condense light towards a photodiode 11. The microlens array 100 can include a first microlens 110, a second microlens 120, and a third microlens 130.

Herein, the form of a second microlens 120 positioned at a central area of the microlens array 100 is a dome shape so that its curvature radius is symmetrically formed.

The form of a first microlens 110 positioned at one side of the microlens array 100 has its portion farthest from the second microlens 120 more thickly formed so that its curvature radius is asymmetrically formed.

In addition, in the form of a third microlens 130 positioned at another side of the microlens array 100 has its portion farthest from the second microlens 120 more thickly formed so that its curvature radius is asymmetrically formed.

The form of the microlenses of the microlens array 100 are shaped differently based on their positions to effectively collect light incident from a main lens (not shown).

That is, light is vertically incident to the second microlens 120 positioned in parallel with the optical axis of the main lens. Accordingly, the focus of light to the photosensor (or photodiode 11) is accurately collected.

Also, light is obliquely incident to the first and third microlenses 110 and 130 in an off direction because the microlenses are positioned at a side portion with respect to the optical axis of the main lens.

The microlens array 100 can be formed such that the asymmetry of the respective microlenses increases in the direction away from the optical axis.

Accordingly, the photosensing rate of the photosensor can be increased by means of the form of the microlenses of the microlens array 100.

Figure 1:
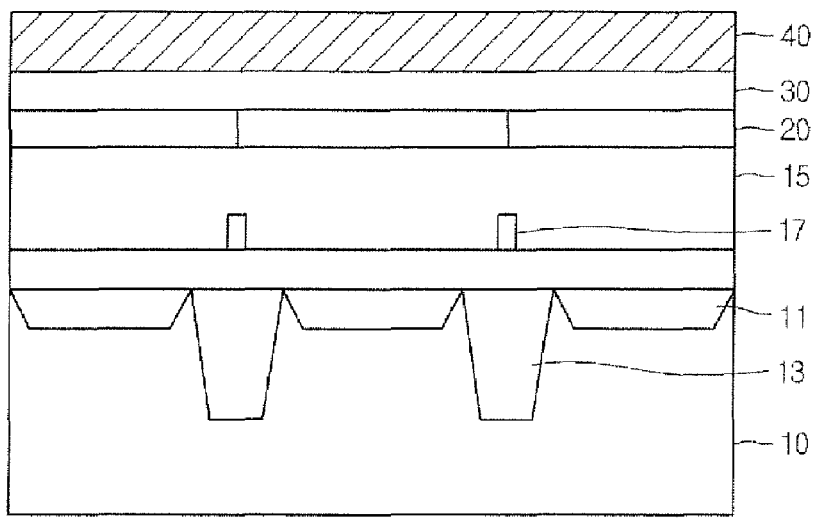
FIGS. 1 to 3 are cross-sectional views showing a fabrication process of an image sensor according to an embodiment.
Figure 2:
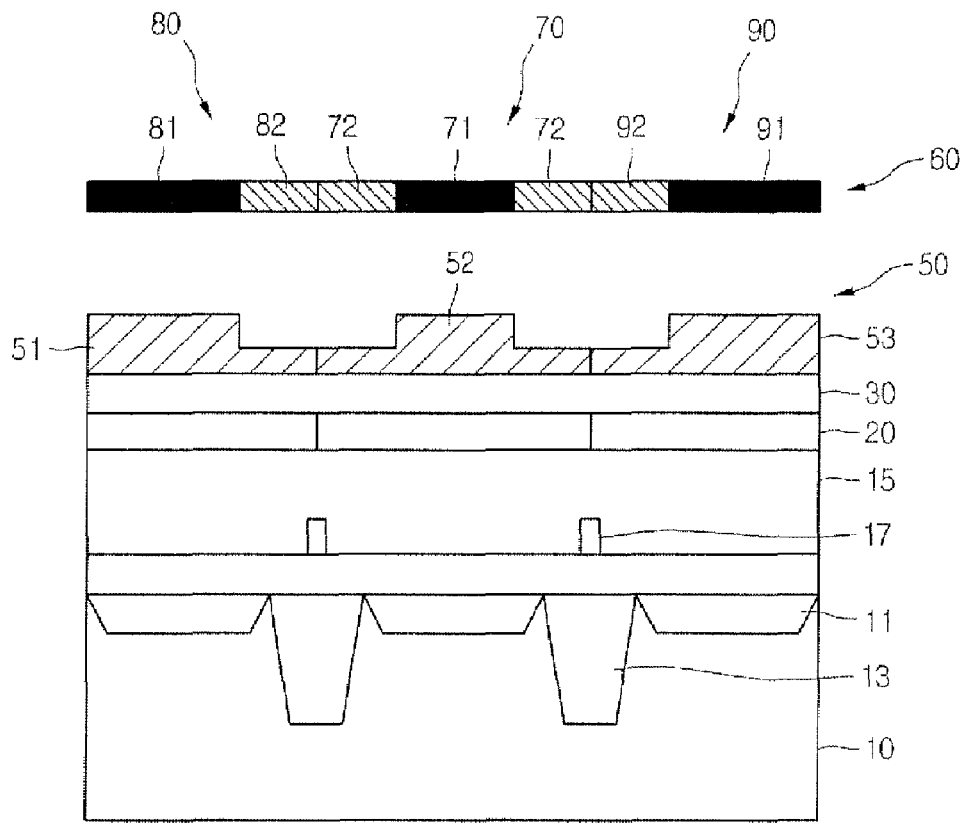

FIGS. 1 to 3 are cross-sectional views showing a process sequence of an image sensor according to an embodiment.

Referring to FIG. 1, a photoresist 40 is coated on a pixel array substrate 10. In one embodiment, the pixel array substrate 10 includes a photosensor including a photodiode.

In particular, a device isolating layer 13 defining an active area and a field (or isolation) area is formed on the pixel array substrate 10. Then the respective unit pixels of the pixel array substrate 10 are formed with a photodiode 11 for receiving light to generate photo-charge and a transistor (not shown) connected to the photodiode 11 for converting the photo-charge into an electrical signal.

Then, an interlayer isolating film 15 and a metal wiring 17 can be formed on the pixel array substrate 10. The metal wiring 17 is intentionally laid out not to block light incident to the photodiode 11.

Although not shown, after forming the final metal wiring layer, in order to protect the layer from moisture or scratching, a protective layer can be formed on the final metal wiring layer.

A color filter array 20 can be formed on the interlayer isolating layer 15. The color filter array 20 is formed using a three-color filter to implement a color image. For example, the three-color filter can use a dyed photoresist. One three-color filter can be included per unit pixels to separate colors from the incident light.

The three-color filter can be formed by sequentially forming a first color filter, a second color filter, and a third color filter. The first color filter layer (not shown) can be formed on the pixel array substrate 10 through a spin coating process. Next, the dyed photoresist is exposed and then developed by means of a pattern mask to form the first color filter on the pixel array substrate 10.

Then, the processes used to form the first color filter are repeated to form the second and third color filters, where each color filter is formed per the respective unit pixels to separate colors from the incident light. Herein, the first, second, and third color filters consist of different colors, for example red, green, and blue, and neighboring color filters have a step difference. In one embodiment, to compensate for the step difference of the color filters, an overcoating layer 30 can be formed on the color filter array 20. The overcoating layer 30 can be a planarization layer.

The microlenses are then formed on the planarized surface.

Referring to FIGS. 2 and 3, after the photoresist 40 for forming the microlenses is coated on the overcoating layer 30 through a spin process, a lens pattern 50 is formed using exposure and developing processes.

At this time, an exposure mask 60 for forming the lens pattern 50 incorporates a phase shift mask.

The phase shift mask uses interference or partial interference of light to expose a desired sized pattern, making it possible to increase resolution or the depth of focus.

The phase shift mask increases the resolution by shifting the phase of light at 0° or 180° in order to prevent the degradation of resolution due to the interference effect between neighboring patterns when exposing the pattern having high distribution density.

Such a phase shift mask is processed to allow the alternatively transmitting light to the pattern to have the phase from 0° to 180° so that it generates a portion where the intensity of light between the neighboring patterns is zero, making it possible to increase the resolution.

That is, the phase shift mask is a mask using the principle that the intensity of light is zero due to the phase shift at the boundary surface between the portions having 0° and 180°.

The phase shift mask includes a phase shift area, a first light transmitting area, and a second light transmitting area so that the phase of light passing through the phase shift area shifts by 180° to generate the offset interference with the light passing through a light transmitting area to improve the resolution and the depth of locus, making it possible to obtain a good pattern.

In particular, in an embodiment, a half tone phase shift mask (PSM) is used. The half tone phase shift mask can be divided into a light blocking area having transmittance of 0%, a partial light transmitting area partially transmitting light, and a light transmitting area transmitting the entire light according to the transmittance adjustment of Cr. Accordingly, the form of the photoresist pattern can be changed by selectively transmitting light by means of the half tone phase shift mask.

Figure 4A:
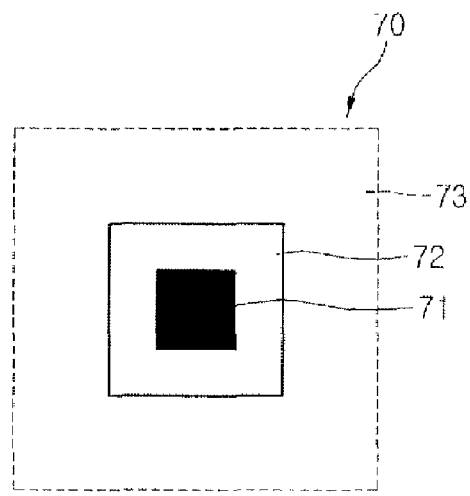
FIGS. 4A to 4C show a form of a mask, a graph showing intensity of light according to the mask form, and a latent image.

FIG. 4A shows a plan view of a half tone mask according to an embodiment.

Referring to FIG. 4A, the half tone mask is a central mask 70 provided with a light blocking area 71 in a central area thereof, a partial light transmitting area 72 outside of the light blocking area 71, and a light transmitting area 73 in the outside of the partial light transmitting area 72.

In the central mask 70, the transmittance of light in the light blocking area 71 blocked by Cr is 0%, the light in the partial light transmitting area 72 is partially transmitted, and the entire light in the light transmitting area 73 is transmitted.

Figure 4B:
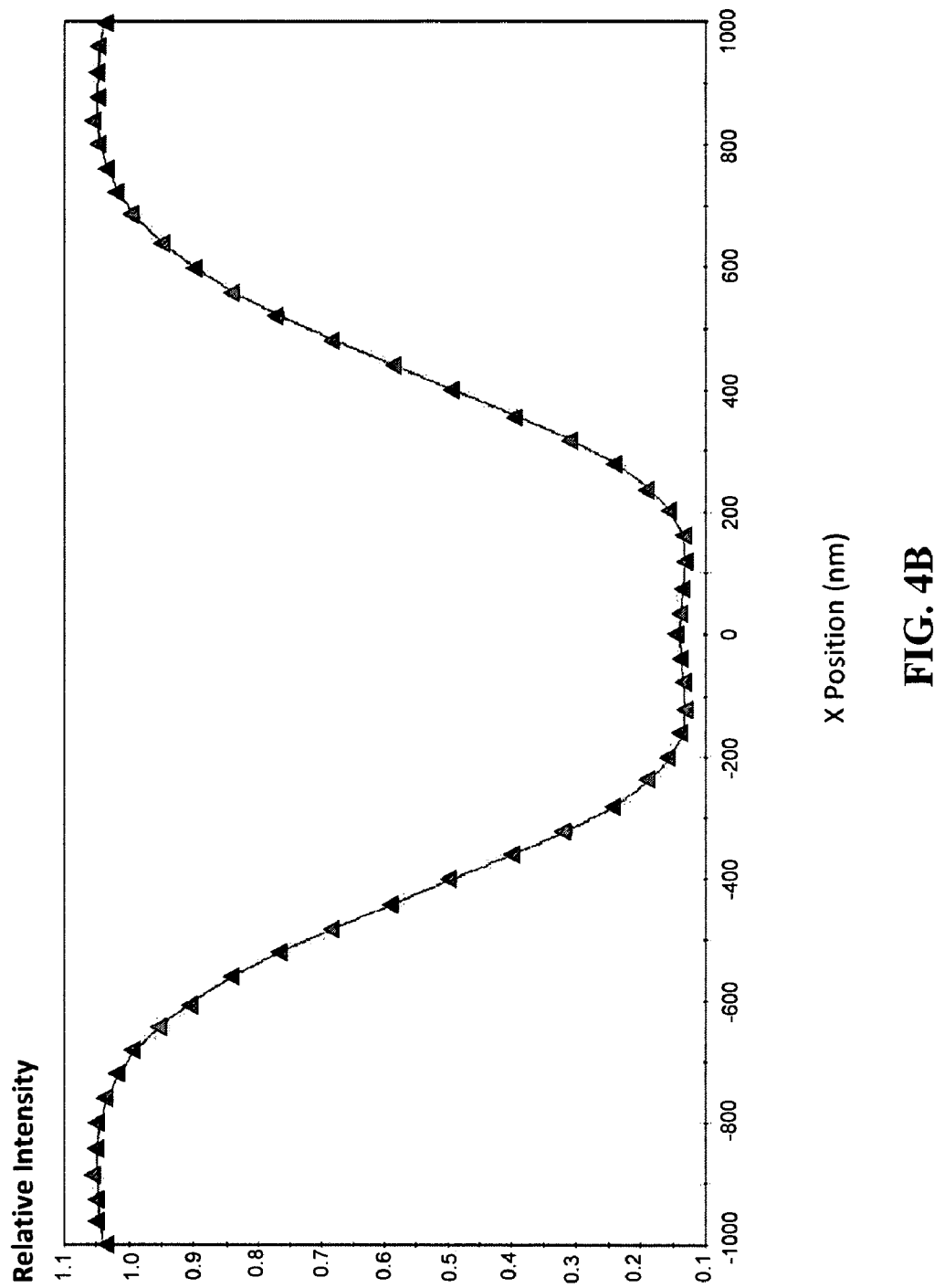

FIG. 4B is a graph showing the intensity of light passing through the central mask, where the an X-axis indicates the position of the light passing through the central mask and the Y-axis indicates the intensity of light according to the position of the light passing through the central mask.

Referring to FIG. 4B, it can be appreciated that the intensity of light in the light blocking area 71 of the central mask 70 is 0. Also, it can be appreciated that the intensity of light in the partial light transmitting area 72 is between 0.1 to 1.0 and the intensity of light in the light transmitting area 73 is 1.0 or more.

Figure 4C:
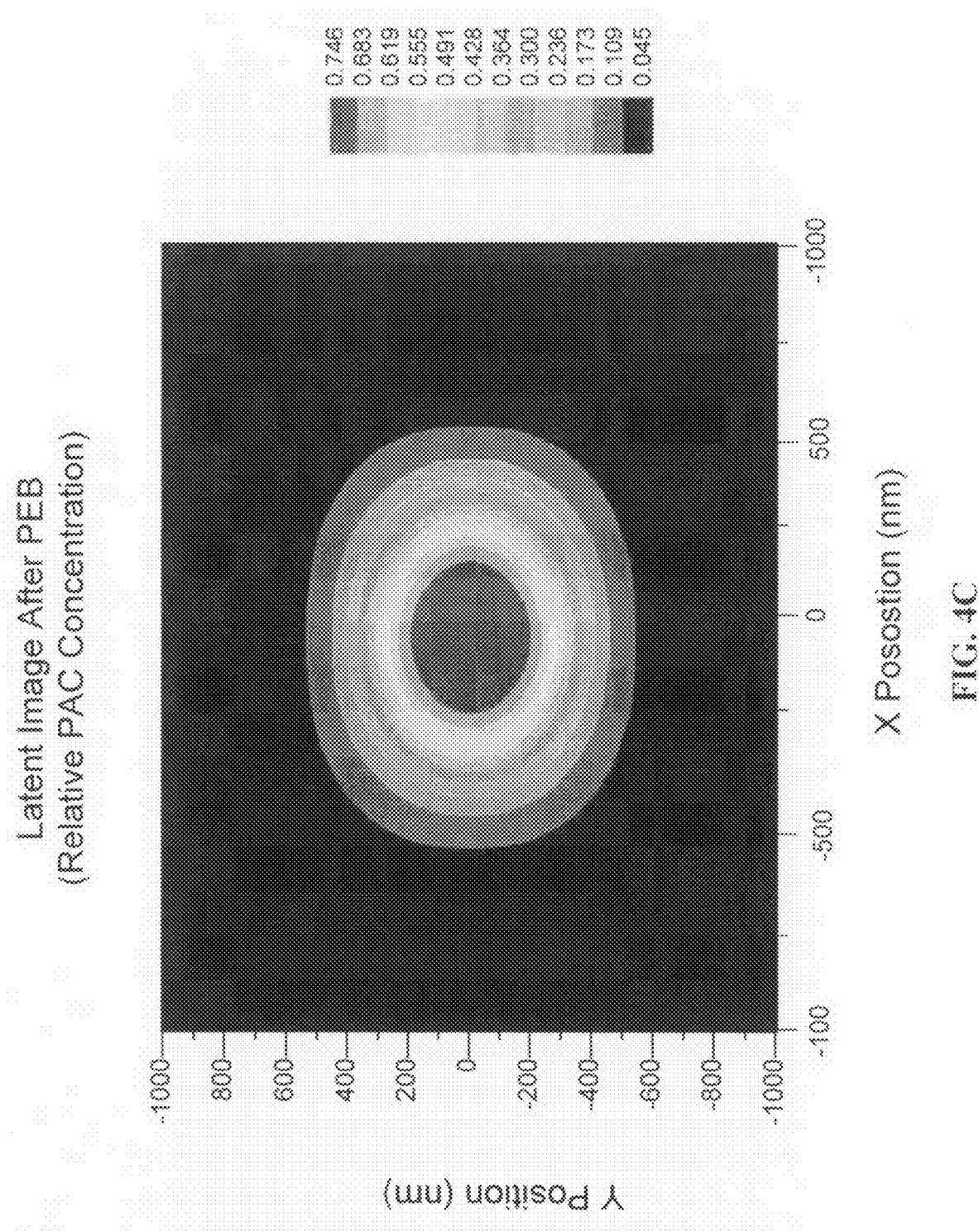

FIG. 4C shows a latent image of the central mask. The X-axis and Y-axis of the latent image indicate the position of the lens pattern and the thickness of the lens pattern according the brightness appearing on the latent image of the lens pattern.

Referring to FIG. 4C, when using the central mask 70, the thickness of the lens pattern becomes more thin as the form of the lens pattern goes from the central area to the edge area.

Figure 5A:
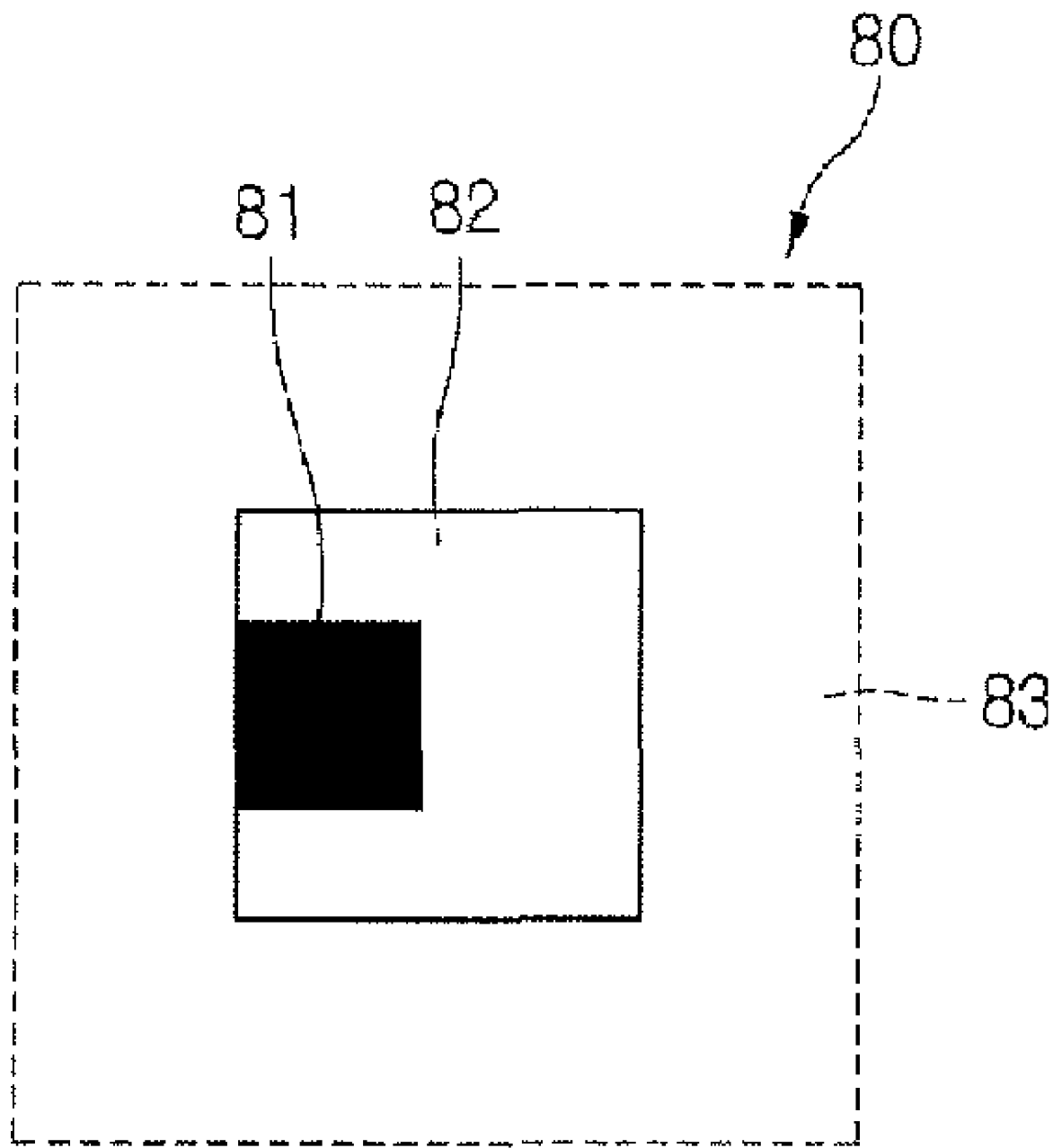
FIGS. 5A to 5C show a form of a mask according to an embodiment, a graph showing intensity of light according to the mask form, and a latent image.

FIG. 5A shows another form of the half tone mask. That is, FIG. 5A shows a left mask 80 in which a left edge of a partial light transmitting area 82 of the mask is formed with a light blocking area 81.

In the left mask 80, the transmittance of light in the light blocking area 81 blocked by Cr is 0%, the light in the partial light transmitting area 82 is partially transmitted, and the entire light in the light transmitting area 83 is transmitted.

Figure 5B:
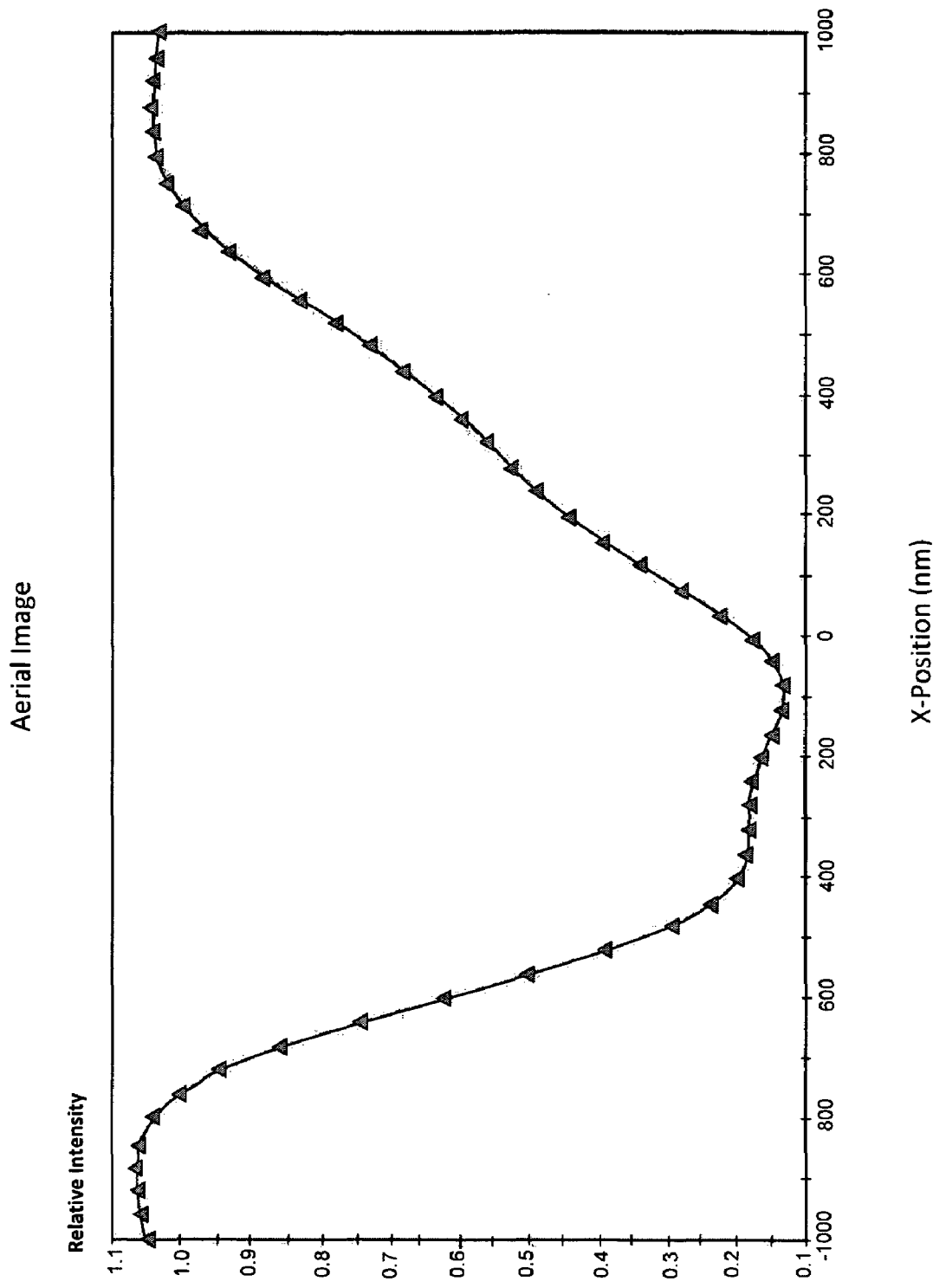

Referring to FIG. 5B, it can be appreciated that the intensity of light in the light blocking area 81 of the left mask 80 is 0. Also, it can be appreciated that the intensity of light in the partial light transmitting area 82 ranges from 0.1 to 1.0, and the intensity of light in the light transmitting area 83 is 1.0 or more.

Also, it can be appreciated that the portion where the intensity of light is 0 is shifted to the left in the graph because the light blocking area 81 is positioned at the left edge of the partial light transmitting area 82.

Figure 5C:
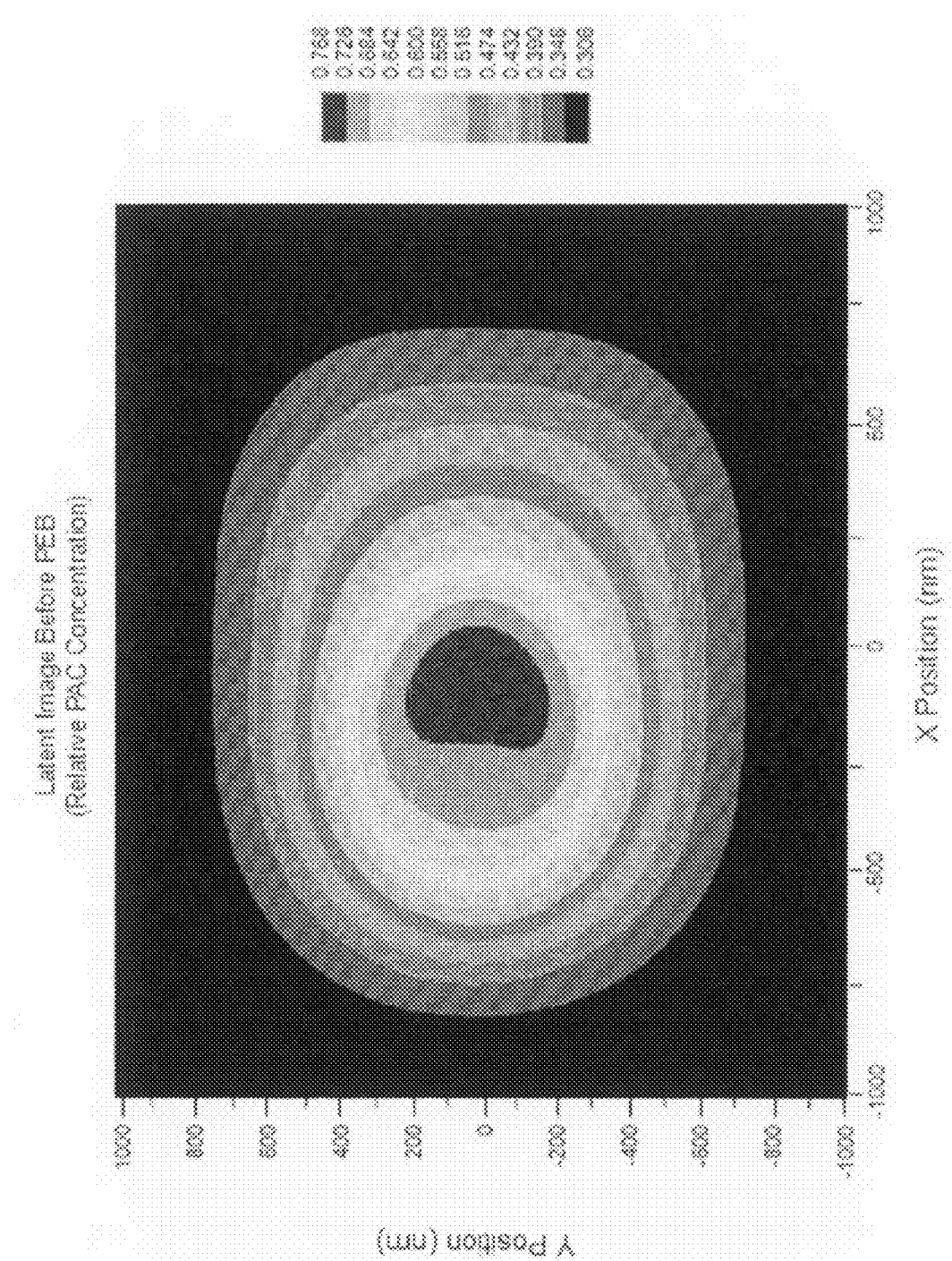

Referring to FIG. 5C, when using the left mask 80, in the form of the lens pattern, the left edge area is thickly formed and the remaining portion is thinly formed.

It can be appreciated that the right mask form 90 of the half tone mask, the graph, and the latent image can be inferred from the left mask form 80, so, the detailed description thereof will be omitted.

Figure 6:
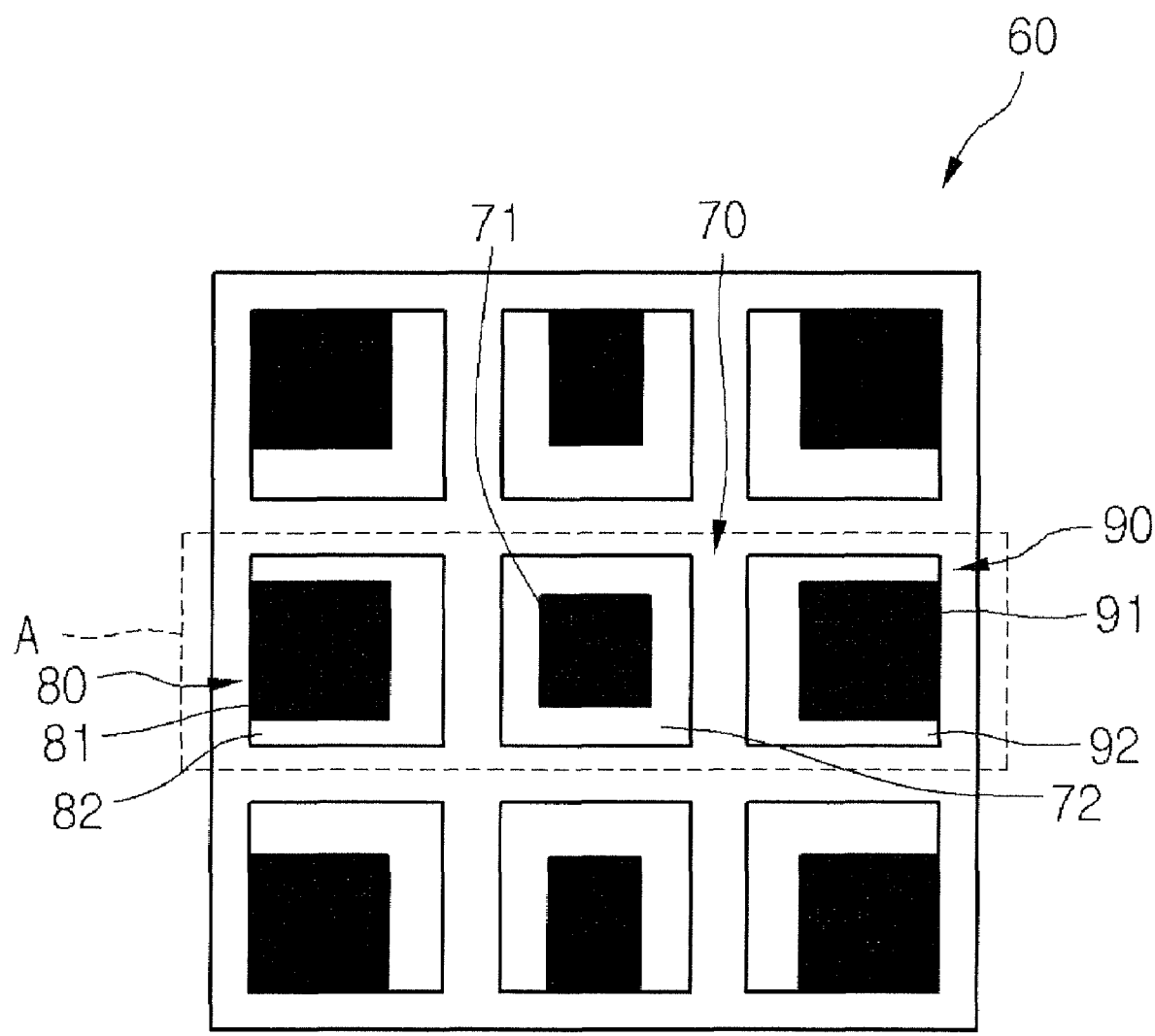
FIG. 6 is a plan view showing an exposure mask according to an embodiment.

FIG. 6 is a plan view showing a schematic structure of a half tone mask, which is an exposure mask 60 of embodiments of the present invention.

Referring to FIG. 6, in the central mask 70 of the central area, which is at the same axis as the light incident from the main lens (not shown), the light blocking area 71 is positioned at the center of the partial light transmitting area 72.

And, in the masks where the light incident from the main lens (not shown) is incident in an off-axis form, the light blocking areas are formed in the edge areas of the partial light transmitting areas.

That is, the light blocking areas 71, 81, and 91 and the partial light blocking areas 72, 82, and 92, which are formed in the respective masks 70, 80, and 90 of the exposure mask 60, are formed at a position corresponding to the relative direction and distance of the light incident from the main lens.

Referring again to FIG. 2, if the photoresist 40 for forming the microlens is exposed and developed using the halftone phase shift mask formed as shown in FIG. 6, the lens pattern array 50 can be formed.

The illustrated lens pattern array 50 is formed by means of the A area of the exposure mask 60 shown in FIG. 6.

In the first lens pattern 51 formed by means of the left mask 80 of the exposure mask 60, the thickness of the lens pattern in the left area is thickly formed by means of the light blocking area 81 of the left mask 80. The remaining area other than the left area of the first lens pattern 51 is formed with the step difference lower than the left area by means of the partial light transmitting area 82.

In the second lens pattern 52 formed by means of the central mask 70, the thickness of the lens pattern in the central area is thickly formed by means of the light blocking area 71 of the mask 70. The remaining area other than the central area of the second lens pattern 52 is formed with the step difference lower than the central area by means of the partial light transmitting area 72.

In the third lens pattern 53 formed by means of the right mask 90, the thickness of the lens pattern in the right area is thickly formed by means of the light blocking area 91 of the mask 90. The remaining area other than the right area of the third lens pattern 53 is formed with the step difference lower than the right area by means of the partial light transmitting area 92.

Referring to FIG. 3, a reflow process can then be performed on the lens pattern array 50 to form the microlens array 100.

At this time, the first microlens 110 has an asymmetrical curvature radius with a thicker left side.

The second microlens 120 has a symmetrical curvature radius in a dome shape.

The third microlens 130 has an asymmetrical curvature radius with a thicker right side.

Accordingly, in the microlens array 100 the thicknesses of the microlenses are formed so that the incidence light can effectively be collected, making it possible to increase the light receiving efficiency of the photosensor in the pixel array.

The fabricating method of the image sensor according to embodiments of the present invention has an effect of correcting the focus shift of the microlens positioned at the edge of the image sensor by forming the shape of the microlens differently according to the positions of the light receiving area using a phase shift mask to suppress the phenomenon in the central movement of the focus so that the light collection rate of the light receiving area can be increased.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A fabricating method of an image sensor comprising:
   coating a photoresist for a microlens on a pixel array substrate;
   forming a lens pattern array, each lens pattern having a step difference therein by exposing and developing the photoresist using an exposure mask; and
   reflowing the lens pattern array to form differently shaped microlenses,
   wherein the exposure mask is a half tone phase shift mask,
   wherein the half tone phase shift mask includes a light blocking area, a partial light transmitting area, and a total light transmitting area for each mask block of the exposure mask.

2. The method according to claim 1, wherein the mask block for a center of the lens pattern array comprises the light blocking area in a central area of the mask block and the partial light transmitting area around the central area of the mask block.

3. The method according to claim 1, wherein the mask block for a left portion of the lens pattern array comprises the light blocking area at a left edge of the mask block and the partial light transmitting area at remaining areas of the mask block.

4. The method according to claim 1, wherein the mask block for a right portion of the lens pattern array comprises the light blocking area at a right edge of the mask block and the partial light transmitting area at remaining areas of the mask block.

5. The method according to claim 1, wherein a thickness of a microlens edge area of a selected microlens of the microlenses is more thickly formed as the selected microlens is positioned farther away from a central region.

6. The method according to claim 1, wherein the surface curvature radius of a selected microlens of the microlenses varies by a larger asymmetry as the selected microlens is positioned farther away from a central region.

* * * * *